US012665175B2

(12) United States Patent
Nishio

(10) Patent No.: US 12,665,175 B2
(45) Date of Patent: Jun. 23, 2026

(54) PLASMA PROCESSING APPARATUS AND MANUFACTURING METHOD OF SEMICONDUCTOR DEVICE

(71) Applicant: Kioxia Corporation, Tokyo (JP)

(72) Inventor: Seiwa Nishio, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 18/535,290

(22) Filed: Dec. 11, 2023

(65) Prior Publication Data

US 2024/0203707 A1     Jun. 20, 2024

(30) Foreign Application Priority Data

Dec. 19, 2022     (JP) .................................. 2022-202346

(51) Int. Cl.
*H01J 37/32*          (2006.01)
*H10P 50/28*         (2026.01)

(52) U.S. Cl.
CPC .... *H01J 37/32834* (2013.01); *H01J 37/3244* (2013.01); *H01J 37/32568* (2013.01); *H10P 50/283* (2026.01); *H01J 2237/334* (2013.01)

(58) Field of Classification Search
None
See application file for complete search history.

(56) References Cited

U.S. PATENT DOCUMENTS

| | | | |
|---|---|---|---|
| 8,852,387 B2 | 10/2014 | Iizuka et al. | |
| 9,869,022 B2 | 1/2018 | Sawada | |
| 10,373,846 B2 | 8/2019 | Kato et al. | |
| 10,483,118 B2 | 11/2019 | Kumakura et al. | |
| 11,145,518 B2 | 10/2021 | Kumakura et al. | |
| 2003/0119328 A1 | 6/2003 | Fujisato | |
| 2011/0132542 A1* | 6/2011 | Iizuka .................. | H01J 37/3244 |
| | | | 156/345.33 |
| 2013/0084408 A1* | 4/2013 | Nakao ..................... | C23C 16/50 |
| | | | 118/723 E |
| 2016/0002787 A1 | 1/2016 | Sawada | |
| 2017/0352560 A1 | 12/2017 | Kato et al. | |
| 2018/0330958 A1 | 11/2018 | Kumakura et al. | |
| 2020/0058512 A1 | 2/2020 | Kumakura et al. | |

(Continued)

FOREIGN PATENT DOCUMENTS

| | | |
|---|---|---|
| CN | 108878285 A | 11/2018 |
| JP | 1027784 A | 1/1998 |

(Continued)

*Primary Examiner* — Stephanie P Duclair
(74) *Attorney, Agent, or Firm* — Maier & Maier, PLLC

(57)          ABSTRACT

A plasma processing apparatus according to an embodiment includes: an upper electrode that supplies a process gas into a processing container; and an exhaust unit that exhausts the inside of the processing container, in which the upper electrode includes: a diffusion portion that is interposed between the first and second surfaces, the diffusion portion in which the process gas is diffused; a plurality of gas supply holes that supplies the process gas into the processing container, the plurality of gas supply holes arranged on the first surface; and a plurality of gas exhaust holes arranged on the second surface, the plurality of gas exhaust holes being connected to the exhaust unit, and the total area of the plurality of gas exhaust holes is larger than the total area of the plurality of gas supply holes.

11 Claims, 5 Drawing Sheets

(56)                    References Cited

U.S. PATENT DOCUMENTS

2021/0043425 A1*   2/2021   Sawachi ........... C23C 16/45544
2021/0233776 A1*   7/2021   Ishida .............. H01L 21/02164
2023/0052858 A1    2/2023   Iizuka

FOREIGN PATENT DOCUMENTS

JP          2003197615  A       7/2003
JP          2006310883  A      11/2006
JP             5444044  B2      3/2014
JP          2016017186  A       2/2016
JP             6085106  B2      2/2017
JP          2017216391  A      12/2017
JP          2021123780  A       8/2021
TW             I442458  B       6/2014

* cited by examiner

CONTROL UNIT

PLASMA PROCESSING APPARATUS AND MANUFACTURING METHOD OF SEMICONDUCTOR DEVICE

CROSS-REFERENCE TO RELATED APPLICATIONS

This application is based upon and claims the benefit of priority from Japanese Patent Application No. 2022-202346, filed on Dec. 19, 2022; the entire contents of which are incorporated herein by reference.

FIELD

Embodiments described herein relate generally to a plasma processing apparatus and a manufacturing method of a semiconductor device.

BACKGROUND

In a manufacturing process of semiconductor devices, cycle processing of repeating a step of treating a substrate with different process gases a plurality of times may be performed. In such cycle processing, it is possible to improve productivity by omitting a stabilization step of stabilizing a flow rate or the like of the process gas at the time of replacing the process gas.

However, with omission of the stabilization step, there are cases where the substrate is processed in a state in which a process gas used in an immediately preceding step is mixed, and the processing characteristics of the substrate are be deteriorated.

DETAILED DESCRIPTION

A plasma processing apparatus according to an embodiment includes: a processing container in which a substrate is capable of being processed; an upper electrode that is capable of supplying a process gas into the processing container; a lower electrode disposed in the processing container in such a manner as to face the upper electrode, the lower electrode on which the substrate is capable of being placed; a power source that is capable of supplying electric power to at least one of the upper electrode and the lower electrode to generate plasma in the processing container; and an exhaust unit that is capable of exhausting an inside of the processing container, in which the upper electrode includes: a first surface facing the lower electrode; a second surface on an opposite side to the first surface; a diffusion portion that is interposed between the first and second surfaces, the diffusion portion in which the process gas is capable of being diffused; a plurality of gas supply holes that is capable of supplying the process gas into the processing container, the plurality of gas supply holes arranged on the first surface; and a plurality of gas exhaust holes arranged on the second surface, the plurality of gas exhaust holes being connected to the exhaust unit, and a total area of the plurality of gas exhaust holes is larger than a total area of the plurality of gas supply holes.

Hereinafter, embodiments of the present invention will be described in detail with reference to the drawings. Note that the present invention is not limited by the embodiments. In addition, components in the following embodiments include those that can be easily conceived by those skilled in the art or those that are substantially the same.

[Configuration Example of Plasma Processing Apparatus]

Figure 1:
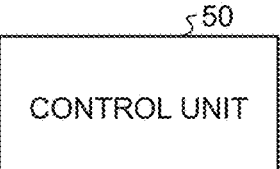
FIG. 1 is a cross-sectional view schematically illustrating an example of a configuration of a plasma processing apparatus according to an embodiment.

FIG. 1 is a cross-sectional view schematically illustrating an example of a configuration of a plasma processing apparatus 1 according to an embodiment. The plasma processing apparatus 1 is configured as, for example, an etching apparatus that performs etching processing on a predetermined layer formed on a wafer 100.

As illustrated in FIG. 1, the plasma processing apparatus 1 includes a chamber 11 as a processing container for processing the wafer 100 as a substrate. The chamber 11 is made of, for example, aluminum, and can be airtightly sealed.

A shower head 18 functioning as an upper electrode is provided in an upper portion of the chamber 11. The shower head 18 includes a lower surface 18a as a first surface facing the inside of the chamber 11 and an upper surface 18b as a second surface provided on the opposite side of the lower surface 18a and supplies a process gas used for processing the wafer 100 into the chamber 11. A gap is interposed between the lower surface 18a and the upper surface 18b of the shower head 18, and the gap serves as a diffusion portion 18c that diffuses the process gas for processing the wafer 100.

A plurality of gas introduction paths 182 and a plurality of gas exhaust holes 183 are provided on the upper surface 18b of the shower head 18.

The plurality of gas introduction paths 182 is connected with a gas supply device via pipes (both not illustrated), and the process gas is introduced from the plurality of gas introduction paths 182 to the diffusion portion 18c.

The plurality of gas exhaust holes 183 is connected to a vacuum pump 14p described later via a gas exhaust pipe 184. An upstream end of the gas exhaust pipe 184 branches into a plurality of parts, each of which is connected to one of the plurality of gas exhaust holes 183. Each of the plurality of branched parts of the gas exhaust pipe 184 is provided with a valve 185. A downstream end of the gas exhaust pipe 184 is connected to the vacuum pump 14p via a branch port 14b provided at a gas exhaust port 14.

The lower surface 18a of the shower head 18 includes a plurality of gas supply holes 181 penetrating up to the chamber 11. The process gas supplied from the gas introduction paths 182 to the diffusion portion 18c is supplied into the chamber 11 through the gas supply holes 181. An electrostatic chuck 20 is disposed below the shower head 18 in such a manner as to face the shower head 18.

The electrostatic chuck 20 horizontally supports the wafer 100 to be processed in the chamber 11, electrostatically attracts the wafer 100, and also functions as a lower electrode. A loading and unloading port (not illustrated) for the wafer 100 is included on a side surface of the chamber 11, and the wafer 100 is placed on the electrostatic chuck 20 in the chamber 11 by a conveyance arm (not illustrated) from the loading and unloading port.

The electrostatic chuck 20 is supported on a support portion 12 protruding, in a tubular shape, vertically upward from a bottom wall near the center of the chamber 11. The support portion 12 supports the electrostatic chuck 20 in the vicinity of the center of the chamber 11 separated from the shower head 18 by a predetermined distance in such a manner as to face the shower head 18 in parallel. With such a structure, the shower head 18 and the electrostatic chuck 20 constitute a pair of parallel plate electrodes.

Meanwhile, the electrostatic chuck 20 includes a chuck mechanism that electrostatically attracts the wafer 100. The chuck mechanism includes a chuck electrode 24, a power source line 45, and a power source 46. The power source 46 is connected to the chuck electrode 24 via the power source line 45. With such a mechanism, DC power is supplied from the power source 46 to the chuck electrode 24, and the upper surface of the electrostatic chuck 20 is electrostatically charged.

A power source line 41 is connected to the electrostatic chuck 20 as the lower electrode. A blocking capacitor 42, a matcher 43, and a radio frequency power source 44 are connected to the power source line 41. At the time of plasma processing, radio frequency power of a predetermined frequency is supplied from the radio frequency power source 44 to the electrostatic chuck 20. With such a mechanism, plasma of the process gas is generated in the chamber 11.

On the outer periphery of the electrostatic chuck 20, an insulator ring 15 is disposed in such a manner as to cover the side surface and a peripheral portion of the bottom surface of the electrostatic chuck 20. An outer peripheral ring 16 is provided on the insulator ring 15 in such a manner as to surround the outer periphery of the electrostatic chuck 20. The outer peripheral ring 16 adjusts an electric field in such a manner that the electric field is not deflected toward a vertical direction at the peripheral edge portion of the wafer 100, namely, a direction perpendicular to a surface of the wafer 100 at the time of etching the wafer 100.

A baffle plate 17 is provided between the insulator ring 15 and the side wall of the chamber 11. The baffle plate 17 has a plurality of gas discharge holes 17e penetrating the baffle plate 17 in the plate thickness direction.

The gas exhaust port 14 is provided at a portion of the chamber 11 below the baffle plate 17. The vacuum pump 14p that exhausts an atmosphere in the chamber 11 is connected to the gas exhaust port 14. The gas exhaust port 14 has the branch port 14b to which the above-described gas exhaust pipe 184 is connected. Incidentally, the vacuum pump 14p is an example of an exhaust unit.

A region partitioned by the electrostatic chuck 20 and the baffle plate 17 in the chamber 11 and the shower head 18 serves as a plasma processing chamber 61. The diffusion portion 18c in the upper part of the chamber 11 that is partitioned by the shower head 18 serves as a gas supply chamber. A lower region in the chamber 11 partitioned by the electrostatic chuck 20 and the baffle plate 17 serves as a gas exhaust chamber 63.

The plasma processing apparatus 1 includes a control unit 50 that controls each unit of the plasma processing apparatus 1 such as the vacuum pump 14p, the radio frequency power source 44, the matcher 43, the power source 46, the valves 185, and the gas supply device. The control unit 50 is configured as a computer including a central processing unit (CPU), a read only memory (ROM), a random access memory (RAM), and others (not illustrated). The control unit 50 may be configured as an application specific integrated circuit (ASIC) or the like having a function for use in the plasma processing apparatus 1.

At the time of plasma processing of the wafer 100, under the control by the control unit 50, the wafer 100 to be processed is placed on the electrostatic chuck 20 and attracted by the chuck mechanism. Furthermore, the inside of the chamber 11 is evacuated by the vacuum pump 14p connected to the gas exhaust port 14. When the inside of the chamber 11 reaches a predetermined pressure, a process gas is supplied from the gas supply device (not illustrated) to the diffusion portion 18c of the shower head 18 and is supplied to the plasma processing chamber 61 via the gas supply hole 181.

In addition, under the control by the control unit 50, a radio frequency voltage is applied to the electrostatic chuck 20 as the lower electrode in a state where the shower head 18 as the upper electrode is grounded, thereby causing plasma to be generated in the plasma processing chamber 61. On the lower electrode side, a potential gradient is generated between the plasma and the wafer 100 due to self-bias by a radio-frequency voltage, ions in the plasma are accelerated towards the electrostatic chuck 20, and anisotropic etching processing is performed.

In addition, the valves 185 connected to the gas exhaust pipe 184 are opened under the control by the control unit 50, and thus an excessive process gas in the diffusion portion 18c is exhausted.

[Configuration Example of Upper Electrode]

Figure 2A:
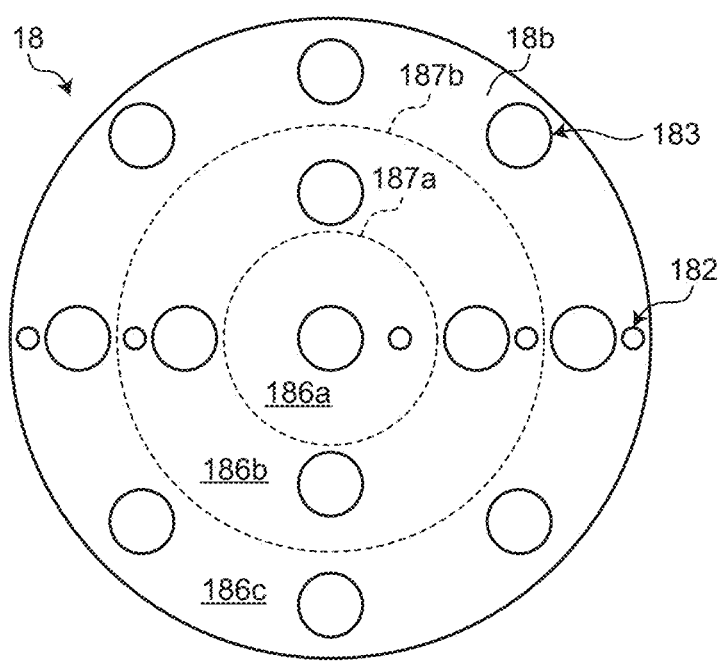
FIGS. 2A and 2B are schematic diagrams illustrating an example of a configuration of a shower head according to the embodiment.
Figure 2B:
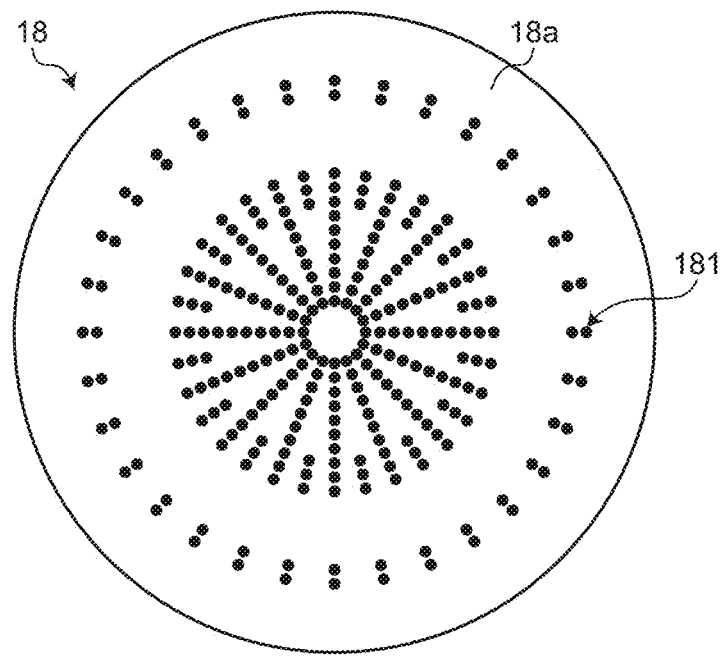

Next, a detailed configuration of the shower head 18 will be described with reference to FIGS. 2A and 2B. FIGS. 2A and 2B are schematic diagrams illustrating an example of a configuration of the shower head 18 according to the embodiment.

FIG. 2A is a diagram of the upper surface 18b of the shower head 18 as viewed from above, and a plurality of partition walls 187a and 187b provided on the back surface of the upper surface 18b, namely, the surface on the diffusion portion 18c side is indicated by broken lines.

As illustrated in FIG. 2A, the plurality of partition walls 187a and 187b protrudes from the upper surface 18b of the shower head 18 into the diffusion portion 18c and partitions the diffusion portion 18c into a plurality of regions.

In the example of FIG. 2A, the two partition walls 187a and 187b are provided concentrically with the upper surface 18b of the shower head 18 having a disk shape. The partition wall 187a is disposed near the center of the upper surface 18b and has a relatively small diameter. The partition wall 187b is disposed closer to the outer periphery of the upper surface 18b and has a larger diameter than that of the partition wall 187a.

Moreover, a central region 186a of the diffusion portion 18c is partitioned from other regions by the partition wall 187a that is closer to the center. An outer peripheral region 186c of the diffusion portion 18c is partitioned from other regions by the partition wall 187b that is closer to the outer periphery. The partition wall 187a and the partition wall 187b partition an intermediate region 186b between the central region 186a and the outer peripheral region 186c from the other regions.

The plurality of gas introduction paths 182 and the plurality of gas exhaust holes 183 described above are dispersedly arranged at positions on the upper surface 18b, the positions corresponding to the respective regions partitioned by the partition walls 187a and 187b. Incidentally, the plurality of gas exhaust holes 183 is dispersedly arranged on the upper surface 18b while avoiding interference with the plurality of gas introduction paths 182.

In the example of FIG. 2A, the plurality of gas introduction paths 182 is linearly aligned in the radial direction and arranged in a dispersed manner in the central region 186a, the intermediate region 186b, and the outer peripheral region 186c. Meanwhile, the plurality of gas exhaust holes 183 is arranged in a radially dispersed manner from the central region 186a to the outer peripheral region 186c through the intermediate region 186b.

As a result, one gas introduction path 182 and one gas exhaust hole 183 are arranged in the central region 186a. Meanwhile, in the intermediate region 186b, two gas introduction paths 182 and four gas exhaust holes 183 are arranged. In the outer peripheral region 186c, two gas introduction paths 182 and eight gas exhaust holes 183 are arranged.

FIG. 2B is a diagram of the lower surface 18a of the shower head 18 as viewed from below.

As illustrated in FIG. 2B, the plurality of gas supply holes 181 described above is dispersedly arranged on the lower surface 18a of the shower head 18. In the example of FIG. 2B, the plurality of gas supply holes 181 is divided into those close to the center of the lower surface 18a of the shower head 18 and those close to the outer periphery and is arranged in a radially dispersed manner from the center of the lower surface 18a to the outer periphery.

Here, the total number of the plurality of gas exhaust holes 183 and individual diameters are set in such a manner that the total area of the plurality of gas exhaust holes 183 is larger than the total area of the plurality of gas supply holes 181. In the examples of FIGS. 2A and 2B, the diameter of the plurality of gas exhaust holes 183 is made larger than that of the plurality of gas supply holes 181, of which number is generally larger, thereby making the total area of the plurality of gas exhaust holes 183 larger than the total area of the plurality of gas supply holes 181.

As an example, in a case where the diameter of each of the gas supply holes 181 is less than or equal to 1 mm, for example, 0.5 mm, and about 200 gas supply holes 181 are included, the diameter of each of the gas exhaust holes 183 can be several millimeters to several tens millimeters, for example, 10 mm, and the number of the gas exhaust holes 183 may be about a dozen or so to twenty, for example.

Note that, in the example of FIGS. 2A and 2B, the diameters of the plurality of gas exhaust holes 183 are equal to each other, the diameters of the plurality of gas supply holes 181 are equal to each other, and each of the diameters of the plurality of gas exhaust holes 183 is set to be larger than the diameter of the gas supply holes 181. However, the diameters of the plurality of gas exhaust holes 183 may be different from each other, and a gas exhaust hole 183 having a diameter smaller than those of the gas supply holes 181 may be included. Even in this case, it is sufficient that the total area of the plurality of gas exhaust holes 183 be larger than the total area of the plurality of gas supply holes 181, for example, by setting the average diameter of the plurality of gas exhaust holes 183 to be larger than the average diameter of the plurality of gas supply holes 181.

[Example of Plasma Processing]

Next, an example of plasma processing of the wafer 100 by the plasma processing apparatus 1 according to the embodiment will be described with reference to FIGS. 3A and 3B. The plasma processing of the wafer 100 by the plasma processing apparatus 1 is performed, for example, as a part of a manufacturing process of a semiconductor device.

Figure 3A:
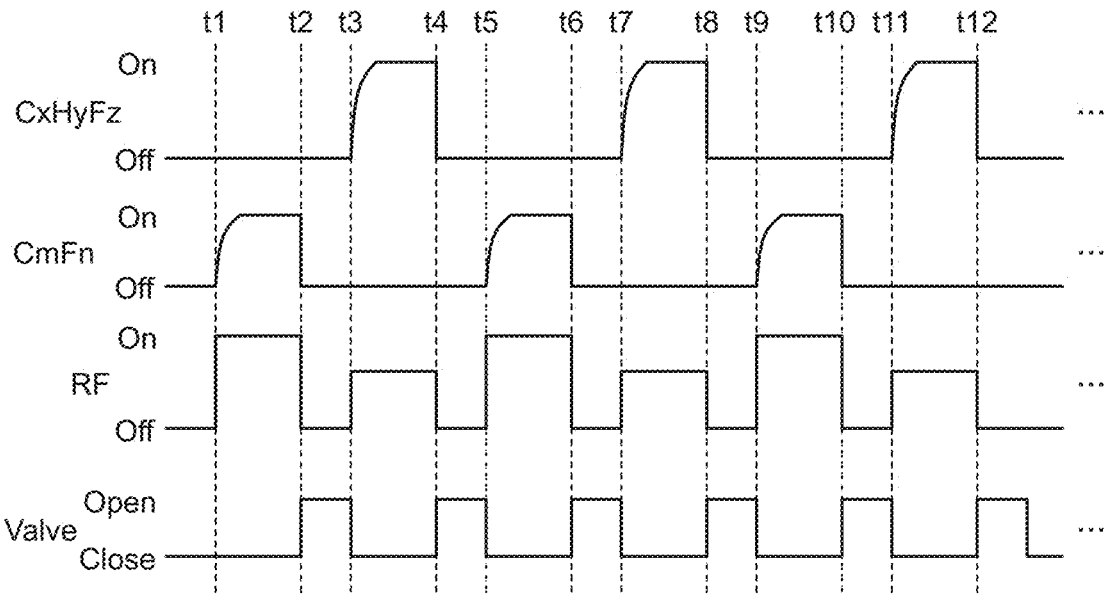
FIGS. 3A and 3B are schematic diagrams for explaining plasma processing of a wafer by the plasma processing apparatus according to the embodiment.
Figure 3B:
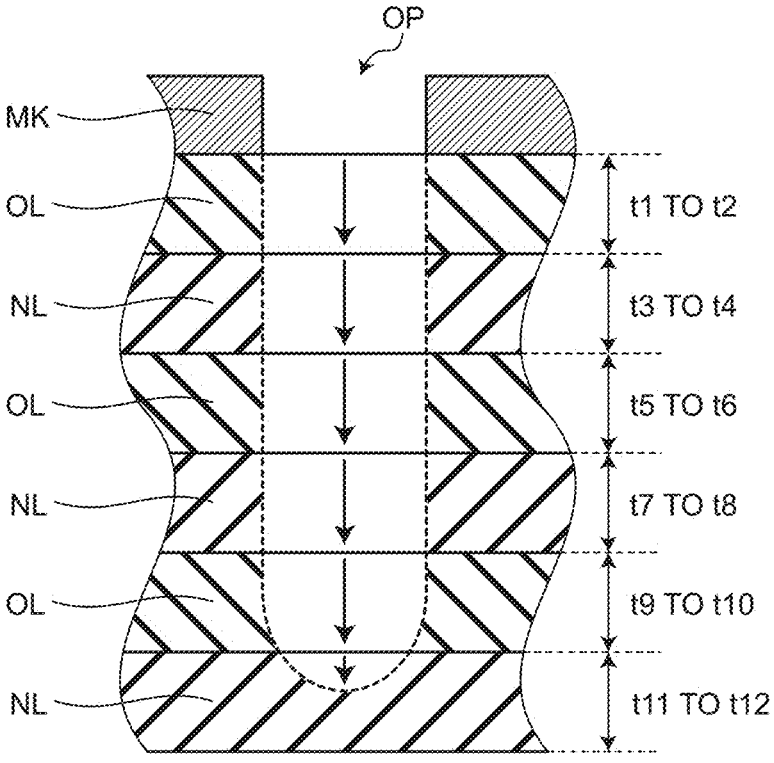

FIGS. 3A and 3B are schematic diagrams for explaining the plasma processing of the wafer 100 by the plasma processing apparatus 1 according to the embodiment. FIG. 3A is a timing chart of the plasma processing, and FIG. 3B is a cross-sectional view of an etching target. In the example of FIGS. 3A and 3B, description will be given on a case where a stacked body in which a plurality of silicon oxide layers OL and a plurality of silicon nitride layers NL are alternately stacked layer by layer is etched by the plasma processing apparatus 1.

At this point, cycle processing is performed in which a step of forming a mask pattern MK having an opening OP in a target region of the etching processing on the upper surface of the stacked body and etching a silicon oxide layer OL as a first layer with plasma using CmFn gas as a first process gas and a step of etching a silicon nitride layer NL as a second layer with plasma using CxHyFz gas as a second process gas are alternately repeated a plurality of times.

By using the CmFn gas for etching the silicon oxide layer OL, the silicon oxide layer OL is selectively etched with respect to the silicon nitride layer NL. By using the CxHyFz gas for etching the silicon nitride layer NL, the silicon nitride layer NL is selectively etched with respect to the silicon oxide layer OL.

As illustrated in FIGS. 3A and 3B, for example, in order to etch the uppermost silicon oxide layer OL, the CmFn gas is introduced from the gas introduction paths 182 into the diffusion portion 18c at time t1, and the CmFn gas is further supplied from the gas supply holes 181 into the chamber 11.

At the same timing as the supply timing of the CmFn gas, at the time t1, radio frequency power (RF) is supplied from the radio frequency power source 44 to the electrostatic chuck 20, thereby generating plasma of the CmFn gas in the chamber 11.

As a result, etching of the uppermost silicon oxide layer OL is started. Note that, immediately after the start of the supply of the CmFn gas, the flow rate of the CmFn gas is stabilized to a desired value after a lapse of some time.

Then, with the plasma of the CmFn gas maintained, for example, for a predetermined period as a first period, the silicon oxide layer OL having a predetermined layer thickness is removed, and an underlying silicon nitride layer NL is exposed at the bottom of the opening OP. At timing of time t2 when the predetermined period has elapsed and the uppermost silicon oxide layer OL is removed, the supply of the radio frequency power from the radio frequency power source 44 is stopped, and the supply of the CmFn gas is stopped.

After the supply of the CmFn gas is stopped at the time t2, the CmFn gas remaining in the chamber 11 is exhausted by the vacuum pump 14p connected to a lower portion of the chamber 11 by time t3. In parallel with the exhausting of the chamber 11, the plurality of valves 185 is opened from time t2 to time t3, and the CmFn gas remaining in the diffusion portion 18c is exhausted from the gas exhaust holes 183 to the vacuum pump 14p via the gas exhaust pipe 184.

Note that, as described above, it is designed that the total area of the plurality of gas exhaust holes 183 be larger than the total area of the plurality of gas supply holes 181. Therefore, in a case where the exhausting is performed from the gas exhaust holes 183 in the upper portion of the chamber 11 and the gas exhaust port 14 in the lower portion of the chamber 11 using the vacuum pump 14p, the pressure in the diffusion portion 18c becomes lower than the pressure in the chamber 11. Therefore, the CmFn gas remaining in the chamber 11 is exhausted via the gas exhaust port 14 in the lower portion of the chamber 11, and the CmFn gas remaining in the diffusion portion 18c is exhausted from the upper portion of the chamber 11 via the gas exhaust holes 183 without flowing into the chamber 11.

After the CmFn gas is exhausted from each of the chamber 11 and the diffusion portion 18c, the valves 185 are closed at the time t3, and the exhausting of the diffusion portion 18c is stopped.

In addition, for example, in order to etch the silicon nitride layer NL exposed to the opening OP with the silicon oxide layer OL as the uppermost layer removed, from the time t3 to time t4, the CxHyFz gas is supplied from the gas introduction paths 182 into the chamber 11 via the diffusion portion 18c and the gas supply holes 181, and the radio frequency power is supplied from the radio frequency power source 44 to generate plasma of the CxHyFz gas in the chamber 11.

As a result, etching of the silicon nitride layer NL exposed by the etching of the silicon oxide layer OL is started. Note that, immediately after the start of the supply of the CxHyFz gas, the flow rate of the CxHyFz gas is stabilized to a desired value after a lapse of some time.

Then, with the plasma of the CxHyFz gas maintained, for example, for a predetermined period as a second period, the silicon nitride layer NL having a predetermined layer thickness is removed, and an underlying silicon oxide layer OL is exposed at the bottom of the opening OP. At timing of the time t4 when the predetermined period has elapsed and the upper silicon nitride layer NL is removed, the supply of the radio frequency power from the radio frequency power source 44 is stopped, and the supply of the CxHyFz gas is stopped.

After the supply of the CxHyFz gas is stopped at the time t4, for a period up to time t5, the vacuum pump 14p connected to the lower portion of the chamber 11 exhausts the CxHyFz gas remaining in the chamber 11, and the plurality of valves 185 is opened to exhaust the CxHyFz gas remaining in the diffusion portion 18c from the gas exhaust holes 183.

Also at this point, the pressure in the diffusion portion 18c becomes lower than the pressure in the chamber 11. Therefore, the CxHyFz gas remaining in the chamber 11 is exhausted via the gas exhaust port 14 in the lower portion of the chamber 11, and the CxHyFz gas remaining in the diffusion portion 18c is exhausted from the upper portion of the chamber 11 via the gas exhaust holes 183 without flowing into the chamber 11.

After the CxHyFz gas is exhausted from each of the chamber 11 and the diffusion portion 18c, the valves 185 are closed at the time t5, and the exhausting of the diffusion portion 18c is stopped.

Then, during a period from the time t5 to time t6, the CmFn gas is supplied into the chamber 11, the radio frequency power is supplied, and a next silicon oxide layer OL is etched with plasma of the CmFn gas.

In addition, during a period from the time t6 to time t7, the CmFn gas remaining in the chamber 11 is exhausted via the gas exhaust port 14, and the valves 185 are opened to exhaust the CmFn gas remaining in the diffusion portion 18c via the gas exhaust holes 183.

Then, the valves 185 are closed, and during a period from the time t7 to time t8, the CxHyFz gas is supplied into the chamber 11, the radio frequency power is supplied, and a next silicon nitride layer NL is etched with plasma of the CxHyFz gas.

In addition, during a period from the time t8 to time t9, the CxHyFz gas remaining in the chamber 11 is exhausted via the gas exhaust port 14, and the valves 185 are opened to exhaust the CxHyFz gas remaining in the diffusion portion 18c via the gas exhaust holes 183.

Then, the valves 185 are closed, and during a period from the time t9 to time t10, the CmFn gas is supplied into the chamber 11, the radio frequency power is supplied, and a next silicon oxide layer OL is etched with plasma of the CmFn gas.

In addition, during a period from the time t10 to time t11, the CmFn gas remaining in the chamber 11 is exhausted via the gas exhaust port 14, and the valves 185 are opened to exhaust the CmFn gas remaining in the diffusion portion 18c via the gas exhaust holes 183.

Then, the valves 185 are closed, and during a period from the time t11 to time t12, the CxHyFz gas is supplied into the chamber 11, the radio frequency power is supplied, and a next silicon nitride layer NL is etched with plasma of the CxHyFz gas.

Then, similarly to the above, the supply of the CmFn gas and the CxHyFz gas is alternately repeated, plasma of these gases is alternately generated, and silicon oxide layers OL and silicon nitride layers NL are etched as appropriate.

As described above, the processing of the wafer 100 by the plasma processing apparatus 1 according to the embodiment ends.

Note that, in FIGS. 3A and 3B, the flow rate of the CxHyFz gas is set to be larger than the flow rate of the CmFn gas, and the radio frequency power at the time of plasma generation of the CxHyFz gas is set to be smaller than the radio frequency power at the time of plasma generation of the CmFn gas so that the steps using different types of gases can be easily distinguished on the drawings. However, the timing charts illustrated in FIGS. 3A and 3B are merely examples, and the flow rate ratio between the CmFn gas and the CxHyFz gas, the magnitude relationship of the radio frequency power at the time of plasma generation of each of the gases, and others can be set in various manners.

[Configuration Example of Semiconductor Device]

Next, with reference to FIG. 4, description will be given on a configuration example of a semiconductor device 2 manufactured by a method including the processing by the plasma processing apparatus 1 described above. Note that hatching is omitted in FIG. 4 in consideration of readability of the drawing. Incidentally, in FIG. 4, both an X direction and a Y direction extend in directions of surfaces of a word line WL to be described later, and the X direction and the Y direction are orthogonal to each other.

Figure 4:
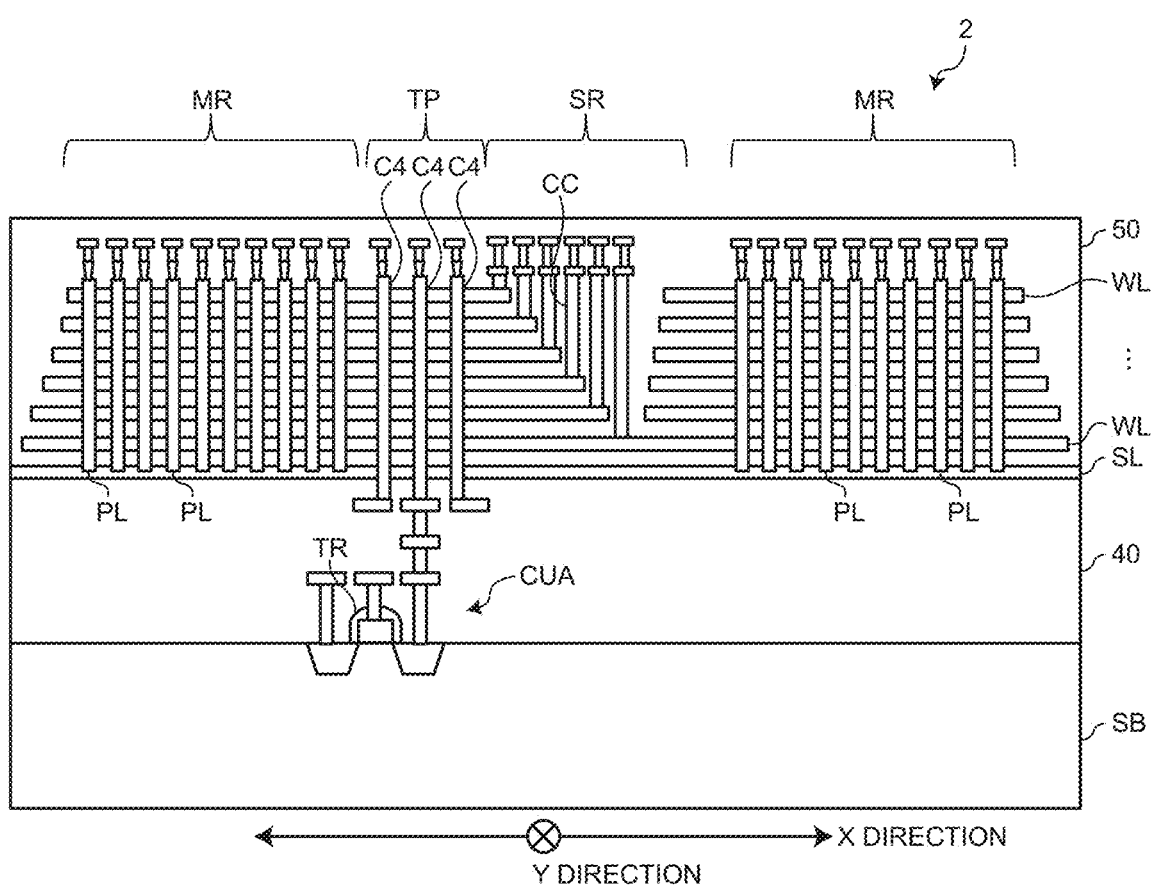
FIG. 4 is a cross-sectional view illustrating an example of a configuration of a semiconductor device manufactured after processing by the plasma processing apparatus according to the embodiment.

As illustrated in FIG. 4, the semiconductor device 2 includes a peripheral circuit CUA, memory regions MR, a through-contact region TP, and a staircase region SR on a substrate SB.

The substrate SB is, for example, a semiconductor substrate such as a silicon substrate. The peripheral circuit CUA including a transistor TR, wiring, and others is disposed on the substrate SB. The peripheral circuit CUA contributes to an operation of a memory cell described later.

The peripheral circuit CUA is covered with an insulating layer 40. A source line SL is disposed on the insulating layer 40. On the source line SL, a plurality of word lines WL is stacked with insulating layers such as silicon oxide layers interposed alternately therebetween. The plurality of word lines WL is covered with an insulating layer 50. The insulating layer 50 also extends around the plurality of word lines WL.

The plurality of word lines WL includes the memory regions MR, the staircase region SR, and the through-contact region TP arranged in the X direction.

The memory regions MR are each disposed at one of both ends in the X direction of the plurality of word lines WL. In the memory regions MR, there is arranged a plurality of pillars PL penetrating the word lines WL in a stacking direction. A plurality of memory cells is formed at intersections of the pillars PL and the word lines WL. As a result, the semiconductor device 2 is configured as, for example, a three-dimensional nonvolatile memory in which memory cells are three-dimensionally arranged in the memory regions MR.

The staircase region SR and the through-contact region TP are arranged at positions between the memory regions MR on both sides in the X direction.

In the staircase region SR, the plurality of word lines WL is dug down stepwise in the stacking direction. That is, the plurality of word lines WL descends stepwise from an X direction side and a Y direction side toward the bottom surface in the staircase region SR.

The word lines WL in the respective layers maintain electrical conduction on both sides in the X direction across the staircase region SR. A contact CC connecting a word line WL of one of the layers and upper-layer wiring is disposed at a terrace portion of each step of the plurality of word lines WL.

As a result, the word lines WL stacked in the plurality of layers can be individually drawn. From these contacts CC, a writing voltage, a reading voltage, and the like are applied to a memory cell in the memory regions MR on both sides in the X direction via a word line WL at the same height position as that of the memory cell.

Through-contacts C4 penetrating the plurality of word lines WL are arranged in the through-contact region TP. The through-contacts C4 connect the peripheral circuit CUA disposed on the substrate SB below and the upper-layer wiring connected to the contacts CC in the staircase region SR. Various voltages applied from a contact CC to a memory cell are controlled by the peripheral circuit CUA via a through-contact C4, the upper-layer wiring, and others.

In manufacturing the semiconductor device 2 as the above, a stacked body is formed in which a plurality of silicon oxide layers and a plurality of silicon nitride layers are alternately stacked layer by layer on the substrate SB via the source line SL, the substrate SB on which the peripheral circuit CUA is formed.

In addition, a partial region of the stacked body is etched in a stepwise manner to form the staircase region SR. In addition, memory holes for forming the pillars PL are similarly formed in the stacked body similarly by etching processing, and the memory holes are filled with a memory layer, a semiconductor layer, and others.

Then, the word lines WL are formed by replacing the plurality of silicon nitride layers of the stacked body with conductive layers by processing called replacement processing. In addition, the contacts CC are formed in the staircase region SR, and the upper-layer wiring and others are formed in an upper layer of the stacked body.

In the above manufacturing process, for example, the cycle processing by the plasma processing apparatus 1 described above is used when etching processing is performed on the stacked body before the replacement processing. That is, by performing plasma processing on the silicon oxide layers OL and the silicon nitride layers NL of the stacked body while switching the gas type, a desired structure can be formed in the stacked body.

Comparative Example

In a manufacturing process of a semiconductor device, there are cases where plasma processing of etching a structure, in which a plurality of types of layers is stacked, while switching the gas type is performed. In a plasma processing apparatus, it is common to insert a stabilization step between steps having different plasma processing conditions, such as at the time of gas switching. The stabilization step is illustrated in FIG. 5.

Figure 5:
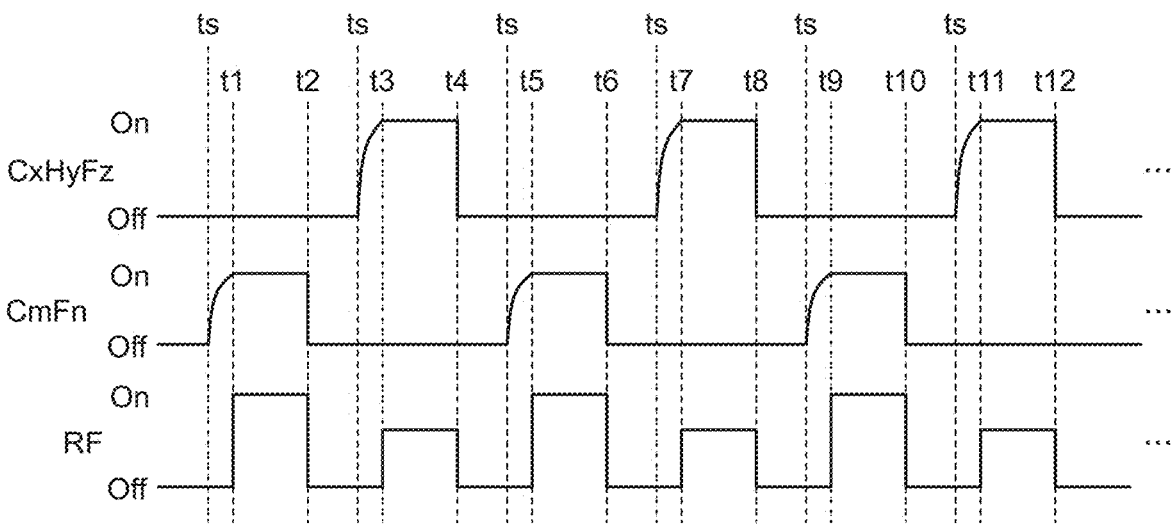
FIG. 5 is a timing chart of plasma processing by a plasma processing apparatus according to a comparative example.

FIG. 5 is a timing chart of plasma processing by a plasma processing apparatus according to a comparative example; and As illustrated in FIG. 5, in the plasma processing of the comparative example, before plasma of the CmFn gas is generated by applying the radio frequency power at times t1, t5, and t9 and before plasma of the CxHyFz gas is generated by applying the radio frequency power at times t3, t7, and t11, supply of the CmFn gas and the CxHyFz gas, respectively, is started at times ts. Then, from the times ts, the stabilization step of stabilizing the flow rate of each of the gases and the pressure in the chamber is performed. After the flow rate of each of the gases and the pressure in the chamber are stabilized at desired values, the plasma processing is started by applying the radio frequency power at timing of the times t1, t5, and t9 or the times t3, t7, and t11.

In addition, in the plasma processing of the comparative example, a step of exhausting a residual gas from the inside of the chamber is included during periods from the stoppage of the supply of the CmFn gas at the times t2, t6, and t10 to next times ts and during periods from the stoppage of the supply of the CxHyFz gas at the times t4, t8, and t12 to next times ts.

Meanwhile, as the lamination structure includes more layers, it takes more time to perform the plasma processing, thereby reducing the throughput. Therefore, there are cases where, for example, the stabilization steps at the time of switching the gas is omitted to improve the productivity. By omitting the stabilization steps illustrated in FIG. 5 at the time of switching the gas, the effect of improving the throughput can be obtained in a case where the cycle processing is performed on a multi-layered stacked structure.

However, at the time of switching the gas type, there are cases where a process gas used in a previous step remains in the diffusion portion of the shower head. It was found that, in a case where the stabilization steps are omitted, the residual gas is mixed in a next step, thereby deteriorating the plasma processing characteristics. Specifically, in etching processing of different types of layers, for example, a process gas having selectivity for the other layer is used, and thus it is conceivable that the mixed residual gas may decrease the selectivity ratio with respect to the other layer. As a result, in the process of removing one layer, the other layer as an underlying layer is also removed, thereby deteriorating the controllability of the process.

According to the plasma processing apparatus 1 of the embodiment, the shower head 18 includes the plurality of gas supply holes 181 that supplies the process gas into the chamber 11, the plurality of gas supply holes 181 arranged on the lower surface 18a, and the plurality of gas exhaust holes 183 arranged on the upper surface 18b and connected to the vacuum pump 14p. Moreover, the total area of the plurality of gas exhaust holes 183 is larger than the total area of the plurality of gas supply holes 181.

With such a device configuration, it is possible to exhaust the process gas of a previous step remaining in the diffusion portion 18c from the upper portion of the chamber 11 at the time of switching the gas type. Since the total area of the gas exhaust holes 183 is larger than that of the gas supply holes 181, it also suppresses the remaining process gas from being supplied into the chamber 11. As a result, even in a case where the stabilization steps are omitted, the processing characteristics of the wafer 100 can be improved.

According to the plasma processing apparatus 1 of the embodiment, the plurality of gas exhaust holes 183 is dispersedly arranged at the positions of the upper surface 18*b* corresponding to the plurality of regions of the diffusion portion 18*c* divided by the partition walls 187*a* and 187*b*. As a result, it is possible to exhaust the remaining process gas from each of the divided regions of the diffusion portion 18*c*.

According to the manufacturing method of the semiconductor device 2 of the embodiment, after plasma generation of the CmFn gas and supply of the CmFn gas are stopped, the CmFn gas in the diffusion portion 18*c* is exhausted via the plurality of gas exhaust holes 183 arranged on the upper surface 18*b* of the shower head 18 before the CxHyFz gas is supplied. As a result, even in a case where the stabilization steps are omitted, the processing characteristics of the wafer 100 can be improved.

According to the manufacturing method of the semiconductor device 2 of the embodiment, when the CmFn gas in the diffusion portion 18*c* is exhausted, the inside of the chamber 11 is exhausted in parallel with the exhaust of the CmFn gas in the diffusion portion 18*c*, and at this point, control is performed in such a manner that the pressure in the diffusion portion 18*c* is lower than the pressure in the chamber 11.

As a result, it is possible to suppress the remaining CmFn gas from being supplied into the chamber 11 and to further suppress the CmFn gas from being mixed into the CxHyFz gas in a next step.

In addition, as described above, since the exhaust of the diffusion portion 18*c* is performed in parallel with the exhaust of the inside of the chamber 11 through the gas exhaust port 14, it is possible to maintain the effect of improving the throughput by omitting the stabilization steps even when the exhaust of the inside of the diffusion portion 18*c* is performed.

According to the manufacturing method of the semiconductor device 2 of the embodiment, when the CmFn gas in the diffusion portion 18*c* is exhausted, the valves 185 provided between the plurality of gas exhaust holes 183 and the vacuum pump 14*p* that exhausts the inside of the chamber 11 are opened to exhaust the CmFn gas, and the valves 185 are closed to stop the exhaust of the diffusion portion 18*c* before the CxHyFz gas is supplied. As a result, with the gas exhaust holes 183 and others included in the shower head 18, the influence on the plasma processing can be suppressed.

According to the manufacturing method of the semiconductor device 2 of the embodiment, a gas type with which a silicon oxide layer OL is selectively etched with respect to the silicon nitride layer NL is selected as the process gas of the silicon oxide layer OL, and a gas type with which the silicon nitride layer NL is selectively etched with respect to the silicon oxide layer OL is selected as the process gas of the silicon nitride layer NL.

Even in a case where the cycle processing, in which stabilization steps are omitted, is performed using these process gases, it is possible to suppress deterioration of the selection ratio of each layer due to mixing of the process gas of the silicon oxide layer OL and the process gas of the silicon nitride layer NL.

Note that, in the above-described embodiment, a valve 185 is provided at each of the branched upstream ends of the gas exhaust pipe 184 for each of the plurality of gas exhaust holes 183; however, at least a valve may be provided to the gas exhaust pipe 184 on the downstream side that is integrated into one. Moreover, the valve provided to the gas exhaust pipe 184 may be a butterfly valve or the like capable of adjusting the exhaust amount of the residual gas by changing the opening degree.

In addition, in the above-described embodiment, in the plasma processing apparatus 1, the radio frequency power is applied to the electrostatic chuck 20 which is the lower electrode; however, the radio frequency power may be applied to the shower head 18 which is the upper electrode or may be applied to both the upper and lower electrodes. In addition, the plasma processing apparatus may be an apparatus using another plasma source such as inductively coupled plasma (ICP).

In the above-described embodiment, the plasma processing apparatus 1 is an etching apparatus that etches a predetermined layer on the wafer 100. However, the above-described configuration of the embodiment is also applicable to a chemical vapor deposition (CVD) apparatus that forms a predetermined layer on a wafer, an ashing apparatus that removes an organic layer such as a resist layer, or others.

Modification

Next, an example of plasma processing according to a modification of the embodiment will be described with reference to FIG. 6. The plasma processing of the modification is different from that of the above-described embodiment in that a next process gas is supplied in advance at the time of switching the gas type.

Note that, in the following description, FIGS. 1 to 2B and others of the above embodiment are cited, and similar symbols to those of the plasma processing apparatus 1 of the above embodiment are used for respective components of a plasma processing apparatus.

Figure 6:
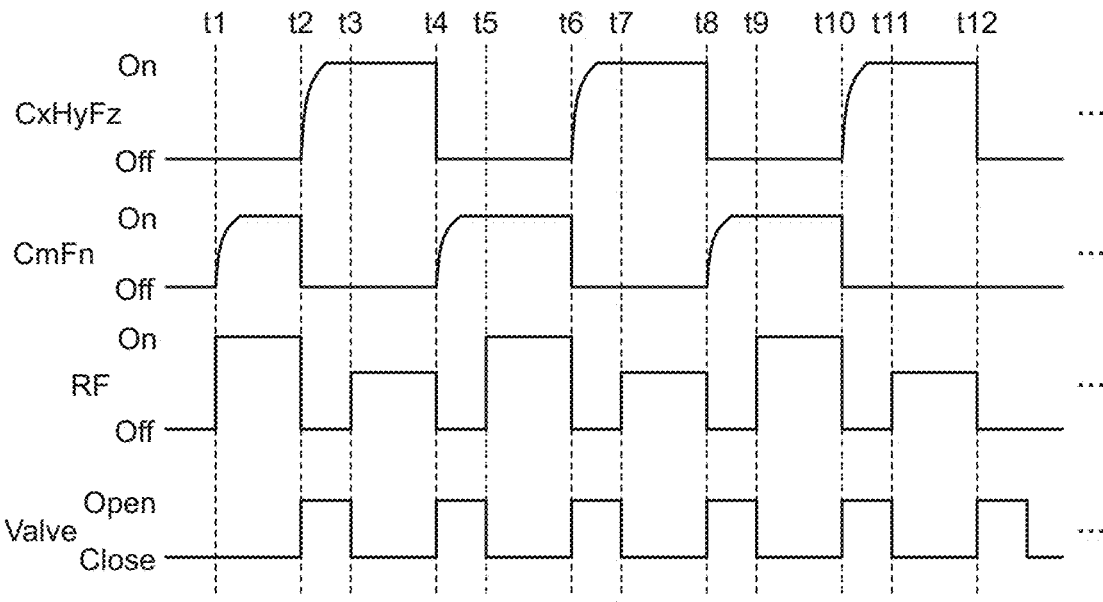
FIG. 6 is a timing chart of plasma processing by a plasma processing apparatus according to a modification of the embodiment.

FIG. 6 is a timing chart of plasma processing by a plasma processing apparatus according to a modification of the embodiment.

As illustrated in FIG. 6, also in the plasma processing of the modification, the cycle processing of alternately repeating the step of etching a silicon oxide layer OL with plasma using the CmFn gas and the step of etching a silicon nitride layer NL with plasma using the CxHyFz gas a plurality of times is performed.

That is, during a period from time t1 to time t2, the CmFn gas is supplied into a chamber 11, radio frequency power is supplied, and a silicon oxide layer OL is etched with plasma of the CmFn gas.

In addition, during a period from the time t2 to time t3, the CmFn gas remaining in the chamber 11 is exhausted via a gas exhaust port 14, and valves 185 are opened to exhaust the CmFn gas remaining in a diffusion portion 18*c* via gas exhaust holes 183.

In the plasma processing of the modification, in parallel with the exhaust of the CmFn gas, introduction of the CxHyFz gas, which is the process gas of a next step, from gas introduction paths 182 to the diffusion portion 18*c* is started at the time t2.

As described above, with the introduction of the CxHyFz gas into the diffusion portion 18*c* started at the timing before the time t3 at which the next plasma processing is started, the flow rate of the CxHyFz gas can be stabilized, for example, before next plasma processing is started at the time t3.

Therefore, it is possible to proceed to the next step more quickly, and the processing characteristics in the plasma processing with the CxHyFz gas are improved.

In addition, even if the flow rate of the CxHyFz gas cannot be sufficiently stabilized between the time t2 and the time t3 that is within the exhaust time of the inside of the diffusion portion 18c, a time required for the flow rate of the CxHyFz gas to be stabilized after the plasma processing is started at the time t3 can be shortened. This makes it possible to shorten the time during which the plasma processing progresses while the flow rate of the CxHyFz gas is still unstable, and even in this case, the processing characteristics of the plasma processing with the CxHyFz gas are improved.

At this point, the inside of the diffusion portion 18c is being exhausted via the gas exhaust holes 183. Therefore, most of the CxHyFz gas introduced into the diffusion portion 18c is not supplied into the chamber 11 and is exhausted as it is from the gas exhaust holes 183 together with the CmFn gas remaining in the diffusion portion 18c. As a result, even if the introduction of the CxHyFz gas is started during the exhaust of the CmFn gas, the exhaust of the CmFn gas, for example, from the inside of the chamber 11 and the inside of the diffusion portion 18c can be suppressed from being inhibited.

Then, the valves 185 are closed while the introduction of the CxHyFz gas into the diffusion portion 18c is continued, the supply of the CxHyFz gas into the chamber 11 is started, and a silicon nitride layer NL is etched with plasma of the CxHyFz gas by supplying radio frequency power during a period from the time t3 to time t4.

In addition, during a period from the time t4 to time t5, the CxHyFz gas remaining in the chamber 11 is exhausted via the gas exhaust port 14, and the valves 185 are opened to exhaust the CxHyFz gas remaining in the diffusion portion 18c via the gas exhaust holes 183.

In the plasma processing of the modification, also at this point, introduction of the CmFn gas, which is a process gas of a next step, from the gas introduction paths 182 to the diffusion portion 18c is started at the time t4 in parallel with the exhaust of the CxHyFz gas.

In this manner, by starting the introduction of the CmFn gas into the diffusion portion 18c at the timing before time t5 at which the next plasma processing is started, the flow rate of the CmFn gas can be stabilized, for example, before the next plasma processing is started at the time t5, or the time required until the flow rate of the CmFn gas is stabilized after the next plasma processing is started can be shortened. It is also possible to proceed to a next step more quickly.

In addition, most of the CmFn gas introduced into the diffusion portion 18c is not supplied into the chamber 11 but is exhausted as it is from the gas exhaust holes 183 together with the CxHyFz gas remaining in the diffusion portion 18c. For this reason, the exhaust of the CxHyFz gas, for example, from the inside of the chamber 11 and the inside of the diffusion portion 18c can be suppressed from being inhibited.

Then, the valves 185 are closed while introduction of the CmFn gas into the diffusion portion 18c is continued, supply of the CmFn gas into the chamber 11 is started, and a silicon oxide layer OL is etched with plasma of the CmFn gas by supplying radio frequency power during a period from the time t5 to time t6.

Then, similarly to the above, the supply of the CmFn gas and the CxHyFz gas is alternately repeated, plasma of these gases is alternately generated, and silicon oxide layers OL and silicon nitride layers NL are etched as appropriate.

With the above, the plasma processing of the embodiment ends.

Note that, in the example of FIG. 6, the timing at which the valves 185 are opened and exhaust of the inside of the diffusion portion 18c is started and the timing at which introduction of the process gases of the CmFn gas and the CxHyFz gas into the diffusion portion 18c is started are at the same time. However, in a case where the time required from the start of introduction of a process gas to stabilization of the flow rate is sufficiently short, introduction of each of the process gases into the diffusion portion 18c may be started later than the timing at which exhaust of the inside of the diffusion portion 18c is started.

According to the plasma processing apparatus of the modification, when the CmFn gas in the diffusion portion 18c is exhausted, introduction of the CxHyFz gas into the diffusion portion 18c is started in parallel with the exhaust of the CmFn gas in the diffusion portion 18c. This makes it possible to quickly proceed to a next step and to further improve the throughput of the plasma processing apparatus. It is also possible to stabilize the flow rate of the CxHyFz gas at the time of next plasma processing and to further improve the processing characteristics of the wafer.

The plasma processing apparatus according to the modification achieves other similar effects to those of the plasma processing apparatus 1 according to the above-described embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, the manufacturing method comprising:

loading a substrate into a processing container in which the substrate is processed;

placing the substrate on a lower electrode facing an upper electrode in the processing container;

supplying a first process gas from a plurality of gas supply holes arranged on a first surface of the upper electrode, the first surface facing the lower electrode;

generating plasma of the first process gas in the processing container during a first period by supplying electric power to at least one of the upper electrode and the lower electrode;

stopping generation of the plasma and supply of the first process gas after the first period has elapsed;

supplying a second process gas from the plurality of gas supply holes arranged on the first surface;

generating plasma of the second process gas in the processing container during a second period by supplying electric power to at least one of the upper electrode and the lower electrode; and after the generation of the plasma and the supply of the first process gas are stopped, and before the supply of the second process gas, exhausting the first process gas in a diffusion portion via a plurality of gas exhaust holes arranged on a second surface on an opposite side to the first surface and separated from the first surface by the diffusion portion, the diffusion portion in which the first process gas is diffused, wherein when the first process gas in the diffusion portion is exhausted, exhausting an inside of the processing container in parallel with the exhaust of the first process gas in the diffusion portion while performing control in such a manner that a pressure in the diffusion portion is lower than a pressure in the processing container.

2. The manufacturing method of a semiconductor device according to claim 1, wherein a total area of the plurality of gas exhaust holes is larger than a total area of the plurality of gas supply holes.

3. The manufacturing method of a semiconductor device according to claim 1, wherein an average diameter of the plurality of gas exhaust holes is larger than an average diameter of the plurality of gas supply holes.

4. The manufacturing method of a semiconductor device according to claim 1, wherein the upper electrode further includes a partition wall that partitions the diffusion portion into a plurality of regions, and the plurality of gas exhaust holes is dispersedly arranged at positions corresponding to the plurality of regions on the second surface.

5. The manufacturing method of a semiconductor device according to claim 1, the manufacturing method comprising:

when the first process gas in the diffusion portion is exhausted, exhausting the first process gas by opening a valve provided between the plurality of gas exhaust holes and an exhaust unit that exhausts the inside of the processing container.

6. The manufacturing method of a semiconductor device according to claim 5, the manufacturing method comprising:

stopping the exhaust of the diffusion portion by closing the valve after exhausting the first process gas and before supplying the second process gas.

7. The manufacturing method of a semiconductor device according to claim 1, the manufacturing method comprising:

repeating plasma generation of the first process gas and plasma generation of the second process gas a plurality of times; and when generating the plasma of the first process gas after generating the plasma of the second process gas, exhausting the second process gas in the diffusion portion via the plurality of gas exhaust holes after the second period has elapsed and the generation of the plasma and the supply of the second process gas are stopped and before the first process gas is supplied.

8. The manufacturing method of a semiconductor device according to claim 7, the manufacturing method comprising:

when the second process gas in the diffusion portion is exhausted, exhausting the second process gas by opening a valve provided between the plurality of gas exhaust holes and an exhaust unit that exhausts the inside of the processing container.

9. The manufacturing method of a semiconductor device according to claim 8, the manufacturing method comprising:

stopping the exhaust of the diffusion portion by closing the valve after exhausting the second process gas and before supplying the first process gas.

10. The manufacturing method of a semiconductor device according to claim 7, the manufacturing method comprising:

etching a first layer on the substrate with the plasma of the first process gas; and etching a second layer on the substrate with the plasma of the second process gas.

11. The manufacturing method of a semiconductor device according to claim 10, the manufacturing method comprising:

as the first process gas, selecting a gas species with which the first layer is selectively etched with respect to the second layer by the plasma of the first process gas; and as the second process gas, selecting a gas species with which the second layer is selectively etched with respect to the first layer by the plasma of the second process gas.

\* \* \* \* \*